(12) United States Patent
Farahvash et al.

(10) Patent No.: US 7,868,710 B1
(45) Date of Patent: Jan. 11, 2011

(54) DIGITALLY-CONTROLLED CRYSTAL OSCILLATOR CIRCUIT

(75) Inventors: Shayan Farahvash, Cupertino, CA (US); Chee Kwang Quek, Sunnyvale, CA (US); Monica Mak, Sunnyvale, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 85 days.

(21) Appl. No.: 12/365,528

(22) Filed: Feb. 4, 2009

(51) Int. Cl.
*H03B 5/32* (2006.01)
(52) U.S. Cl. .................. 331/179; 331/158; 331/177 V
(58) Field of Classification Search ............. 331/116 R, 331/116 FE, 158, 160, 177 V, 177 R, 179
See application file for complete search history.

(56) References Cited

U.S. PATENT DOCUMENTS

| | | | |
|---|---|---|---|
| 6,281,761 B1 * | 8/2001 | Shin et al. .............. | 331/116 FE |
| 6,304,152 B1 * | 10/2001 | Takahashi et al. ...... | 331/116 FE |
| 6,747,522 B2 * | 6/2004 | Pietruszynski et al. .. | 331/177 R |
| 6,888,418 B2 * | 5/2005 | Yin ........................... | 331/158 |
| 6,946,923 B2 * | 9/2005 | Knickerbocker et al. .... | 331/160 |
| 2006/0244546 A1 * | 11/2006 | Yamamoto .................. | 331/158 |

OTHER PUBLICATIONS

Vittoz, Eric et al., "High-Performance Crystal Oscillator Circuits: Theory and Application," IEEE Journal of Solid-State Circuits, Jun. 1988, pp. 774-783, vol. 23, No. 3, IEEE.
Lin, Jerry (Heng-Chic), "A Low-Phase-Noise 0.004-ppm/Step DCXO With Guaranteed Monotonicity in the 90-nm CMOS Process," IEEE Journal of Solid-State Circuits, Dec. 2005, pp. 2726-2734, vol. 40, No. 12, IEEE.
Allen, P.E. et al, "CMOS Analog Circuit Design," 2002, pp. 168-177, Second Edition, Oxford.
Gray, P.R. et al., "Design of Analog Integrated Circuits," 2001, pp. 316-327, Fourth Edition, John Wiley.
Grebene, A.B., "Bipolar and MOS Analog Integrated Circuit Design," 1984, pp. 840-843, John Wiley.
Matthys, R.J., "Crystal Oscillator Circuits," 1983, pp. 126-135, John Wiley.
Rhea, R.W., "Oscillator Design and Computer Simulation," 1995, pp. 248-251, Noble Publishing.
Schereier, R. et al., "Understanding Delta-Sigma Data Converters," 2005, pp. 28-35, John Wiley.

* cited by examiner

*Primary Examiner*—Robert Pascal
*Assistant Examiner*—Ryan Johnson
(74) *Attorney, Agent, or Firm*—Withrow & Terranova, P.L.L.C.

(57) ABSTRACT

The present invention relates to a digitally-controlled crystal oscillator (DCXO) circuit having control circuitry, an active core, and a pair of thermometer-coded switched-capacitor circuits (TCSCCs), each of which is coupled to the active core and to a crystal. The active core, the crystal, and the pair of TCSCCs form a DCXO, which provides an output signal having an output frequency. Each TCSCC includes multiple capacitive elements, which are selected by a respective control signal from the control circuitry to control the output frequency. The DCXO circuit may be integrated into a digital integrated circuit (IC) without need for a digital-to-analog converter (DAC), and may be used with a wide range of crystal types. By using thermometer-coding, the pair of TCSCCs provides monotonic frequency tuning behavior. Further, by utilizing different types of tuning steps, the DCXO may have a wide tuning range with high resolution.

24 Claims, 10 Drawing Sheets

DIGITALLY-CONTROLLED CRYSTAL OSCILLATOR CIRCUIT

FIELD OF THE INVENTION

Embodiments of the present invention relate to crystal oscillator circuits, which may be used to provide reference clocks, particularly in wireless communications systems.

BACKGROUND OF THE INVENTION

Electronics systems incorporating digital circuitry typically need at least one reference clock. Traditional systems may use at least one crystal oscillator module, each of which typically includes a resonating crystal coupled to an active core, to provide a stable reference clock source having a reference clock frequency. However, as technology evolves and circuit geometries become smaller, an increasing proportion of circuitry is integrated into integrated circuits (ICs). As such, a crystal oscillator module may be replaced with a partially integrated crystal oscillator having a resonating crystal coupled to an active core, which has been integrated into an IC, particularly a digital IC.

Some electronics systems, such as wireless communications systems, may need at least one reference clock having a high degree of accuracy, having precise harmonic content, or both. The reference clock may be provided by a crystal oscillator. For example, when establishing communications between a mobile terminal, such as a cell phone, and a base station, such as a repeater on a cell tower, the absolute accuracy of transmitted data and received data must meet certain accuracy requirements for proper operation. To meet the accuracy requirements, an accurate reference clock may be required. In one wireless communications protocol, the absolute accuracy of a reference clock in a mobile terminal must be within five parts-per-million (PPM) under all operating conditions. Additionally, to minimize timing inaccuracy between a base station and a mobile terminal, the base station may send commands to the mobile terminal, thereby instructing the mobile terminal to make adjustments to its reference clock. Therefore, the base station and the mobile terminal may effectively form a clock recovery loop (CRL) for making adjustments to the mobile terminal's reference clock.

As in most control loops, to avoid anomalous behavior, the frequency adjustments to the reference clock must be monotonic. Monotonic behavior in control loops is well known in the art. However, in a simple description, monotonic frequency adjustments include either a frequency step that is intended to increase the frequency, which results in an actual increase in the frequency, or a frequency step that is intended to decrease the frequency, which results in an actual decrease in the frequency. A frequency step that is intended to increase the frequency which results in an actual decrease in the frequency is not monotonic. Similarly, a frequency step that is intended to decrease the frequency which results in an actual increase in the frequency is not monotonic.

Mobile terminals, such as cell phones, are typically battery-powered and may be subjected to wide supply voltage variations from the battery, wide temperature variations, or both. Additionally, resonating crystals, such as quartz crystals, may have an initial inaccuracy of a resonating frequency, may have a drift of the resonating frequency when operated over a wide temperature range, may have a drift of the resonating frequency as a crystal ages, or any combination thereof. Therefore, a crystal oscillator, particularly in a mobile terminal, may need a method for controlling the reference clock frequency having a high degree of resolution to obtain the needed frequency tolerance and a relatively wide tuning range to accommodate all of the frequency variations. In a partially integrated clock oscillator, the IC may be a digital IC; therefore, the method for controlling the reference clock frequency needs to be integrated into the digital IC as much as possible.

When the crystal oscillator is manufactured, the initial frequency inaccuracy of the crystal oscillator may be determined and then reduced or eliminated when operating the crystal oscillator by adjusting the reference clock frequency. Additionally, temperature drift characteristics of the crystal oscillator may be measured, pre-determined, or pre-estimated before using the crystal oscillator. Then, when operating the crystal oscillator, the temperature of the crystal oscillator may be measured and used with the temperature drift characteristics to adjust the reference clock frequency to reduce or eliminate the effects of temperature drift.

Traditional methods for controlling the reference clock frequency may involve a varactor diode coupled to the resonating crystal, such that a direct current (DC) bias voltage on the varactor diode is provided from a digital-to-analog converter (DAC). The DC bias voltage controls the capacitance of the varactor diode, thereby controlling the reference clock frequency by tuning an anti-resonant frequency of the crystal. Since the frequency tuning method needs a high degree of resolution and a wide tuning range, the DAC may need a wide dynamic range with high resolution. Such a DAC may be on the order of about 14-bits, which may not be suitable for integration due to large physical size, high power consumption, digital IC technology limitations, or any combination thereof.

A digital IC that includes the active core of a partially integrated crystal oscillator may be used in different designs and may need to accommodate a wide range of crystal types having variations in operating characteristics, such as an anti-resonant frequency, power loss, and quality factor. Crystals having a low quality factor may require an active core with a higher gain to ensure reliable operation and keep crystal start-up times reasonably low. However, an active core with excessive gain may have higher bias current, which may cause poor phase noise performance and unacceptable high harmonic content. Therefore, the gain of the active core needs to be within acceptable limits for proper operation. Thus, there is a need for a partially integrated crystal oscillator integrated using a digital IC incorporating a digital-control approach without a DAC, having a relatively wide tuning range with high resolution, having monotonic frequency tuning behavior, that operates over a wide temperature range, that operates over a wide supply voltage range, that is able to accommodate a wide range of crystal types having different circuit characteristics, that is compensated for initial frequency inaccuracy, that is compensated for temperature drift, or any combination thereof.

SUMMARY OF THE EMBODIMENTS

The present invention relates to a digitally-controlled crystal oscillator (DCXO) circuit having control circuitry, an active core, and a pair of thermometer-coded switched-capacitor circuits (TCSCCs), each of which is coupled to the active core and to a crystal. The active core, the crystal, and the pair of TCSCCs form a DCXO, which provides an output signal having an output frequency. Each TCSCC includes multiple capacitive elements, which are selected by a respective control signal from the control circuitry to control the output frequency. The DCXO circuit may be integrated into a digital integrated circuit (IC) without the need for a digitalto-analog converter (DAC), and may be used with a wide range of crystal types. By using thermometer-coding, the pair of TCSCCs provide monotonic frequency tuning behavior. Further, by utilizing different types of tuning steps, the DCXO may have a wide tuning range with high resolution.

Each TCSCC provides a capacitance to the crystal oscillator based on the respectively selected capacitive elements of the TCSCC. The output frequency is based on the active core, the crystal, and the capacitances provided by the pair of TCSCCs. During a fine tuning step, the capacitance of one TCSCC is increased and the capacitance of the other TCSCC is decreased to provide a tuning step having high resolution. In one embodiment of the present invention, during a coarse tuning step, the capacitance of both TCSCCs is increased or decreased to provide a tuning step having a large step size, which provides a wide tuning range. During a nominal tuning step, the capacitance of one TCSCC is increased or decreased, while the capacitance of the other TCSCC is held constant to provide a tuning step having a nominal step size.

In different embodiments of the present invention, the DCXO circuit may be provided using different crystal oscillator architectures, such as a Pierce crystal oscillator, a Colpitts crystal oscillator, or the like. The DCXO circuit may be a temperature-compensated DCXO circuit, which may include a temperature sensor that provides a temperature signal to the control circuitry indicative of a temperature of the DCXO circuit. The control circuitry may use the temperature signal to control the output frequency to maintain a constant output frequency as the temperature of the DCXO changes. Some wireless communications standards may mandate an output frequency error of less than about five parts-per-million (PPM).

The DCXO circuit may be used with different crystal types having different operating characteristics, such as quality factor, anti-resonant frequency, required drive level for reliable start-up, or the like. Therefore, in one embodiment of the present invention, the DCXO circuit may operate in either a start-up mode or a normal operation mode. In the start-up mode, the active core operates with a higher gain than when operating in the normal operation mode. The higher gain may increase the reliability of crystal start-up and may reduce the crystal start-up time by compensating for losses in the crystal. However, at the higher gain an amplitude limitation of the active core may cause distortion of the amplified signal, thereby introducing non-linear behavior and harmonics. Such behavior may up-convert flicker noise of active devices in the active core and degrade phase stability of the DCXO. By returning to a normal gain during the normal operation mode, power consumption, phase noise, or both may be reduced. Additionally, a loop gain of the DCXO may be adjusted to compensate for the different operating characteristics of the different crystal types. The DCXO circuit may include an output buffer having a programmable output voltage swing, which may be used to minimize harmonics in a buffered output signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
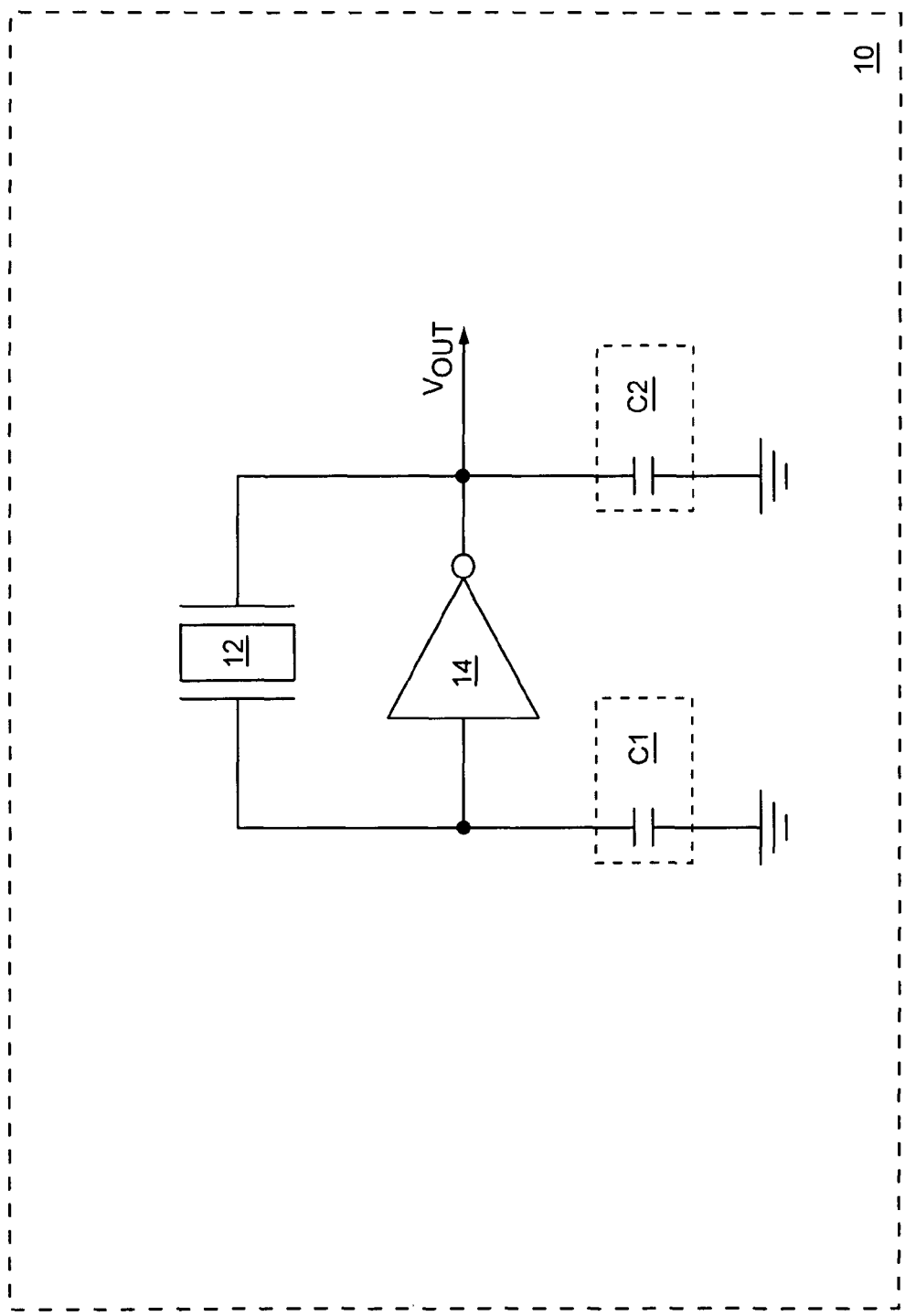
FIG. 1 shows a Pierce crystal oscillator, according to the prior art.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a digitally-controlled crystal oscillator (DCXO) circuit having control circuitry, an active core, and a pair of thermometer-coded switched-capacitor circuits (TCSCCs), each of which is coupled to the active core and to a crystal. The active core, the crystal, and the pair of TCSCCs form a DCXO, which provides an output signal having an output frequency. Each TCSCC includes multiple capacitive elements, which are selected by a respective control signal from the control circuitry to control the output frequency. The DCXO circuit may be integrated into a digital integrated circuit (IC) without the need for a digital-to-analog converter (DAC), and may be used with a wide range of crystal types. By using thermometer-coding, the pair of TCSCCs provide monotonic frequency tuning behavior. Further, by utilizing different types of tuning steps, the DCXO may have a wide tuning range with high resolution.

Each TCSCC provides a capacitance to the crystal oscillator based on the respectively selected capacitive elements of the TCSCC. The output frequency is based on the active core, the crystal, and the capacitances provided by the pair of TCSCCs. During a fine tuning step, the capacitance of one TCSCC is increased and the capacitance of the other TCSCC is decreased to provide a tuning step having high resolution. In one embodiment of the present invention, during a coarse tuning step, the capacitance of both TCSCCs is increased or decreased to provide a tuning step having a large step size, which provides a wide tuning range. During a nominal tuning step, the capacitance of one TCSCC is increased or decreased, while the capacitance of the other TCSCC is held constant to provide a tuning step having a nominal step size.

In different embodiments of the present invention, the DCXO circuit may be provided using different crystal oscillator architectures, such as a Pierce crystal oscillator, a Colpitts crystal oscillator, or the like. The DCXO circuit may be a temperature-compensated DCXO circuit, which may include a temperature sensor that provides a temperature signal to the control circuitry indicative of a temperature of the DCXO. The control circuitry may use the temperature signal to control the output frequency to maintain a constant output frequency as the temperature of the DCXO changes. Some wireless communications standards may mandate an output frequency error of less than about five parts-per-million (PPM).

The DCXO circuit may be used with different crystal types having different operating characteristics, such as quality factor, anti-resonant frequency, required drive level for reliable start-up, or the like. Therefore, in one embodiment of the present invention, the DCXO circuit may operate in either a start-up mode or a normal operation mode. In the start-up mode, the active core operates with a higher gain than when operating in the normal operation mode. The higher gain may increase the reliability of crystal start-up and may reduce the crystal start-up time by compensating for losses in the crystal. However, at the higher gain an amplitude limitation of the active core may cause distortion of the amplified signal, thereby introducing non-linear behavior and introducing harmonics. Such behavior may up-convert flicker noise of active devices in the active core and degrade phase stability of the DCXO. By returning to a normal gain during the normal operation mode, power consumption, phase noise, or both may be reduced. Additionally, the loop gain of the DCXO may be adjusted to compensate for the different operating characteristics of the different crystal types. The DCXO circuit may include an output buffer having a programmable output voltage swing, which may be used to minimize harmonics in a buffered output signal.

FIG. 1 shows a Pierce crystal oscillator 10, according to the prior art. The Pierce crystal oscillator 10 includes a resonating crystal 12, an inverting active core 14 having an input and an output, a first capacitive element C1, and a second capacitive element C2. The output of the inverting active core 14 may provide an output signal $V_{ouT}$ having an output frequency. The resonating crystal 12 is coupled between the input and the output of the inverting active core 14. The first capacitive element C1 is coupled between the input of the inverting active core 14 and ground, and the second capacitive element C2 is coupled between the output of the inverting active core 14 and ground. Since the first and second capacitive elements C1, C2 are both coupled to ground, the series combination of the first and second capacitive elements C1, C2 is effectively coupled in parallel with the resonating crystal 12 to provide feedback from the output of the inverting active core 14 to the input of the inverting active core 14. The inverting active core 14 and the feedback form a feedback loop, or loop. The inverting active core 14 provides about 180 degrees of phase-shift. The Pierce crystal oscillator 10 oscillates at a frequency in which the phase-shift through the feedback is about 180 degrees, such that the phase-shift around the loop is 360 degrees and the gain around the loop is unity. The oscillation frequency of the Pierce crystal oscillator 10 is an anti-resonant frequency of the resonating crystal 12.

Figure 2:
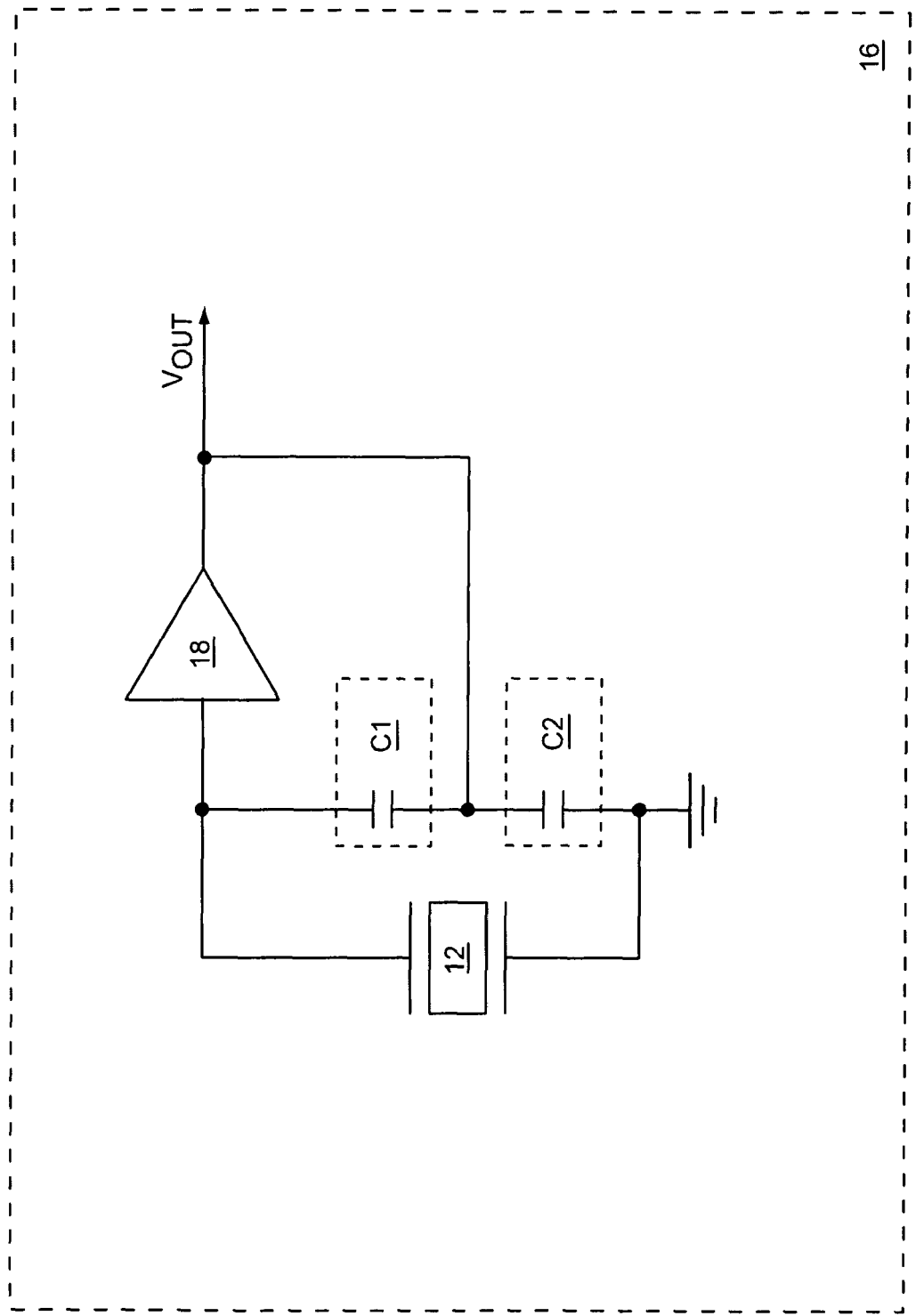
FIG. 2 shows a Colpitts crystal oscillator, according to the prior art.

FIG. 2 shows a Colpitts crystal oscillator 16, according to the prior art. The Colpitts crystal oscillator 16 includes the resonating crystal 12, a non-inverting active core 18 having an input and an output, the first capacitive element C1, and the second capacitive element C2. The output of the non-inverting active core 18 may provide the output signal $V_{OUT}$ having the output frequency. The resonating crystal 12 is coupled between the input of the non-inverting active core 18 and ground. The first capacitive element C1 is coupled between the input and the output of the non-inverting active core 18, and the second capacitive element C2 is coupled between the output of the non-inverting active core 18 and ground. The series combination of the second capacitive element C2 and the resonating crystal 12 are effectively coupled in parallel with the first capacitive element C1 to provide feedback from the output to the input of the non-inverting active core 18. The non-inverting active core 18 and the feedback form a feedback loop, or loop. The non-inverting active core 18 provides about zero degrees of phase-shift. The Colpitts crystal oscillator 16 oscillates at a frequency in which the phase-shift through the feedback is about zero degrees, such that the phase-shift around the loop is 360 degrees and the gain around the loop is unity. The oscillation frequency of the Colpitts crystal oscillator 16 is an anti-resonant frequency of the resonating crystal 12.

Figure 3:
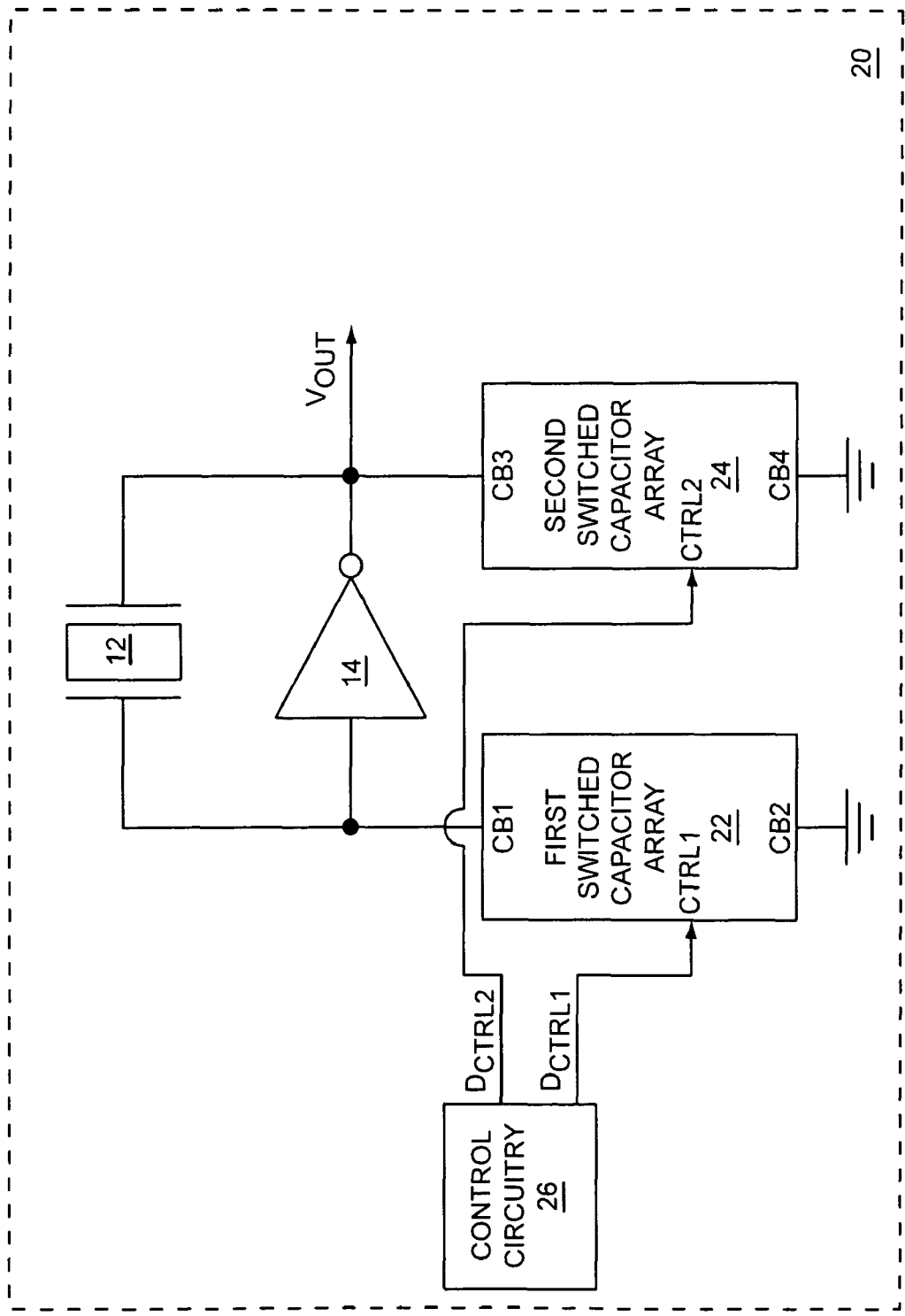
FIG. 3 shows a digitally-controlled Pierce crystal oscillator (DCPXO), according to one embodiment of the present invention.

FIG. 3 shows a digitally-controlled Pierce crystal oscillator (DCPXO) 20, according to one embodiment of the present invention. The DCPXO 20 is similar to the Pierce crystal oscillator 10 illustrated in FIG. 1, except the first and second capacitive elements C1, C2 illustrated in FIG. 1 are replaced with the first and second switched-capacitor arrays 22, 24 in FIG. 3. Additionally, the DCPXO 20 includes control circuitry 26, which provides first and second capacitor control logic signals $D_{CTRL1}$, $D_{CTRL2}$ to first and second control inputs CTRL1, CTRL2 of the first and second switched-capacitor arrays 22, 24, respectively. A first common bus CB1 of the first switched-capacitor array 22 is coupled to the input of the inverting active core 14 and a second common bus CB2 of the first switched-capacitor array 22 is coupled to ground. Similarly, a third common bus CB3 of the second switched-capacitor array 24 is coupled to the output of the inverting active core 14 and a fourth common bus CB4 of the second switched-capacitor array 24 is coupled to ground. In an alternate embodiment of the present invention, the second and fourth common buses CB2, CB4 are coupled to a direct current (DC) reference instead of ground.

The first and second switched-capacitor arrays 22, 24 provide a first capacitance, which is presented between the first common bus CB1 and the second common bus CB2, and a second capacitance, which is presented between the third common bus CB3 and the fourth common bus CB4, respectively. The first switched-capacitor array 22 includes multiple capacitive elements to form a first array, such that each capacitive element of the first array may be either selected or de-selected. A selected capacitive element of the first array contributes to the first capacitance and a de-selected capacitive element of the first array does not contribute to the first capacitance. Similarly, the second switched-capacitor array 24 includes multiple capacitive elements to form a second array, such that each capacitive element of the second array may be either selected or de-selected. A selected capacitive element of the second array contributes to the second capacitance and a de-selected capacitive element of the second array does not contribute to the second capacitance.

The DCPXO 20 oscillates at an output frequency based on the inverting active core 14, the resonating crystal 12, the first capacitance, and the second capacitance. The output signal $V_{OUT}$ has the output frequency. In alternate embodiments of the present invention, the input of the active inverting core 14 or any node associated with any of the resonating elements of the DCPXO 20 may provide the output signal $V_{OUT}$. The control circuitry 26 controls the selection and de-selection of each capacitive element of the first and second arrays using the first and second capacitor control logic signals $D_{CTRL1}$, $D_{CTRL2}$, thereby controlling the first capacitance and the second capacitance, respectively, which controls the output frequency. The DCPXO 20 needs a frequency tuning range that is wide enough to accommodate all of the variations that affect the output frequency, and a frequency tuning resolution that is fine enough to provide an output frequency well within required frequency tolerances. Therefore, the DCPXO 20 includes a sufficient quantity of capacitive elements of the first and second arrays of sufficient capacitance to provide a sufficiently wide tuning range. Additionally, the DCPXO 20 utilizes different types of tuning steps to cover the entire tuning range with sufficient tuning resolution at all capacitance values within the tuning range.

In one embodiment of the DCPXO 20, the capacitance of each capacitive element of the first array may be about equal to one another, the capacitance of each capacitive element of the second array may be about equal to one another, and the capacitance of each capacitive element of the first array may be about equal to the capacitance of each capacitive element of the second array. The control circuitry 26 may select a specific type of tuning step to provide the appropriate tuning resolution to control the output frequency based on an output frequency setpoint. Changing the first capacitance and the second capacitance simultaneously in the same direction provides a maximum change in the output frequency. Therefore, in a coarse tuning step, additional capacitive elements of the first and second arrays may be either selected to decrease the output frequency or de-selected to increase the output frequency, respectively. Since the first and second switched-capacitor arrays 22, 24 are effectively coupled in series, changing the first capacitance while holding the second capacitance constant provides a change in the output frequency that is about one-half the change that is provided by changing both the first and second capacitances. Therefore, in a nominal tuning step, either the first capacitance or the second capacitance is held constant, while the other of the first capacitance or the second capacitance is either increased or decreased by selecting or de-selecting the appropriate capacitive elements.

Since the first and second switched-capacitor arrays 22, 24 are effectively coupled in series, increasing the first capacitance while decreasing the second capacitance to a first order results in no change in effective capacitance. However, such a change does have a second order effect, which is about inversely proportional to the square of the change of the first capacitance or the second capacitance. Therefore, in a fine tuning step, the first capacitance and the second capacitance are changed in opposite directions by selecting and de-selecting additional array elements, as needed. In an exemplary embodiment of the present invention, a coarse tuning step that selects or de-selects one additional capacitive element of the first array and one additional capacitive element of the second array produces a change of about 0.3 PPM of the output frequency, a nominal tuning step that selects or de-selects one additional capacitive element of the first array produces a change of about 0.15 PPM of the output frequency, and a fine tuning step that selects one additional capacitive element of the first array and de-selects one additional capacitive element of the second array produces a change of less than 0.05 PPM of the output frequency.

The specific types of tuning steps may include a first coarse tuning step, whereby the first and second capacitances are both decreased by de-selecting additional capacitive elements of the first and second arrays; a second coarse tuning step, whereby the first and second capacitances are both increased by selecting additional capacitive elements of the first and second arrays; a first nominal tuning step, whereby the first capacitance is decreased by de-selecting at least one additional capacitive element of the first array and the second capacitance is held about constant by neither selecting nor de-selecting any additional capacitive elements of the second array; a second nominal tuning step, whereby the first capacitance is increased by selecting at least one additional capacitive element of the first array and the second capacitance is held about constant by neither selecting nor de-selecting any additional capacitive elements of the second array; a third nominal tuning step, whereby the second capacitance is decreased by de-selecting at least one additional capacitive element of the second array and the first capacitance is held about constant by neither selecting nor de-selecting any additional capacitive elements of the first array; a fourth nominal tuning step, whereby the second capacitance is increased by selecting at least one additional capacitive element of the second array and the first capacitance is held about constant by neither selecting nor de-selecting any additional capacitive elements of the first array; a first fine tuning step, whereby the first capacitance is increased by selecting at least one additional capacitive element of the first array and the second capacitance is decreased by de-selecting at least one additional capacitive element of the second array; and a second fine tuning step, whereby the first capacitance is decreased by de-selecting at least one additional capacitive element of the first array and the second capacitance is increased by selecting at least one additional capacitive element of the second array.

To provide monotonic frequency tuning behavior, thermometer-coding of the first and second switched-capacitor arrays 22, 24 may be used. The term thermometer-coding refers to a behavior similar to a mercury tube thermometer, such that as actual temperature rises the mercury in the tube rises in a continuous manner without any discontinuities. Typically, the thermometer is linear and each step in the temperature is of constant height. Thermometer-coding of either of the first and second switched-capacitor arrays 22, 24 is defined as only selecting additional array capacitive elements of a capacitor array during a tuning step, only de-selecting additional array capacitive elements of a capacitor array during a tuning step, or neither selecting nor de-selecting additional array capacitive elements of an array during a tuning step. Such behavior assures that a tuning step intended to increase capacitance always increases capacitance and a tuning step intended to decrease capacitance always decreases capacitance. Other approaches, such as binary coding, may not be monotonic. For example, de-selecting several binary-weighted capacitors while simultaneously selecting one higher value binary-weighted capacitor may result in a capacitance decrease when a capacitance increase is intended due to tolerance variations of the capacitors. Strict thermometer coding may be used to provide similar behavior when the capacitance decreases and when the capacitance increases. Strict thermometer-coding of either of the first and second switched-capacitor arrays 22, 24 is defined as only selecting additional array capacitive elements of a capacitor array during a tuning step, only de-selecting additional array capacitive elements of a capacitor array during a tuning step, or neither selecting nor de-selecting additional array capacitive elements of an array during a tuning step, such that de-selection of each array capacitive element of a capacitor array is in reverse order to the order in which each array capacitive element of the capacitor array is selected.

In an exemplary embodiment of the present invention, during any tuning step intended to increase the first capacitance, at least one capacitive element of the first array is additionally selected and no capacitive elements of the first array are additionally de-selected; during any tuning step intended to decrease the first capacitance, at least one capacitive element of the first array is additionally de-selected and no capacitive elements of the first array are additionally selected; during any tuning step intended to increase the second capacitance, at least one capacitive element of the second array is additionally selected and no capacitive elements of the second array are additionally de-selected; and during any tuning step intended to decrease the second capacitance, at least one capacitive element of the second array is additionally de-selected and no capacitive elements of the second array are additionally selected.

Figure 4:
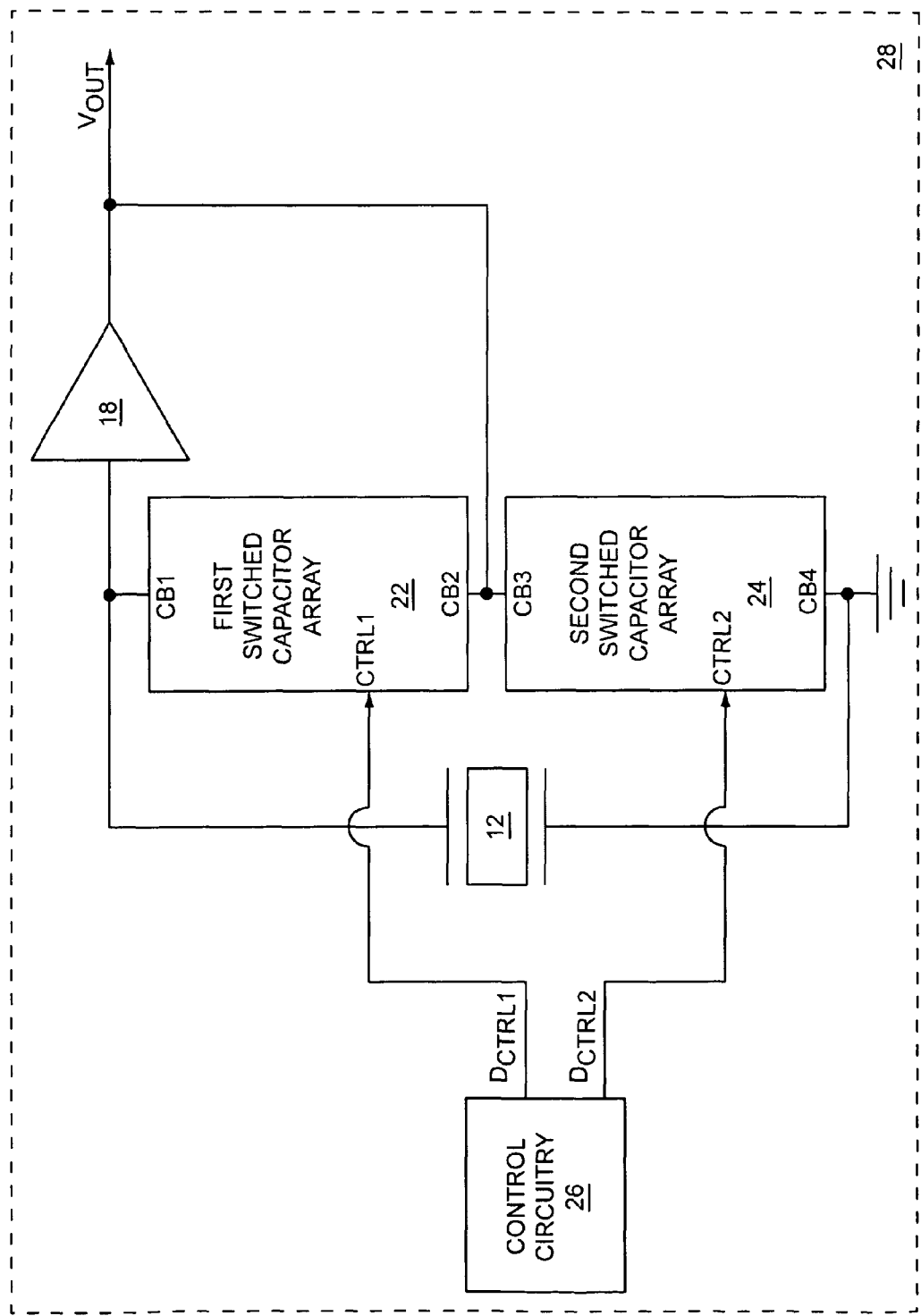
FIG. 4 shows a digitally-controlled Colpitts crystal oscillator (DCCXO), according to an alternate embodiment of the present invention.

FIG. 4 shows a digitally-controlled Colpitts crystal oscillator (DCCXO) 28, according to an alternate embodiment of the present invention. The DCCXO 28 is similar to the Colpitts crystal oscillator 16 illustrated in FIG. 2, except the first and second capacitive elements C1, C2 illustrated in FIG. 2 are replaced with the first and second switched-capacitor arrays 22, 24 in FIG. 4. Additionally, the DCCXO 28 includes the control circuitry 26, which provides the first and second capacitor control logic signals $D_{CTRL1}$, $D_{CTRL2}$ to the first and second control inputs CTRL1, CTRL2 of the first and second switched-capacitor arrays 22, 24, respectively. The first common bus CB1 of the first switched-capacitor array 22 is coupled to the input of the non-inverting active core 18 and the second common bus CB2 of the first switched-capacitor array 22 is coupled to the output of the non-inverting active core 18. Similarly, the third common bus CB3 of the second switched-capacitor array 24 is coupled to the output of the non-inverting active core 18 and the fourth common bus CB4 of the second switched-capacitor array 24 is coupled to ground. In another embodiment of the present invention, the fourth common bus CB4 is coupled to a DC reference instead of ground.

Figure 5:
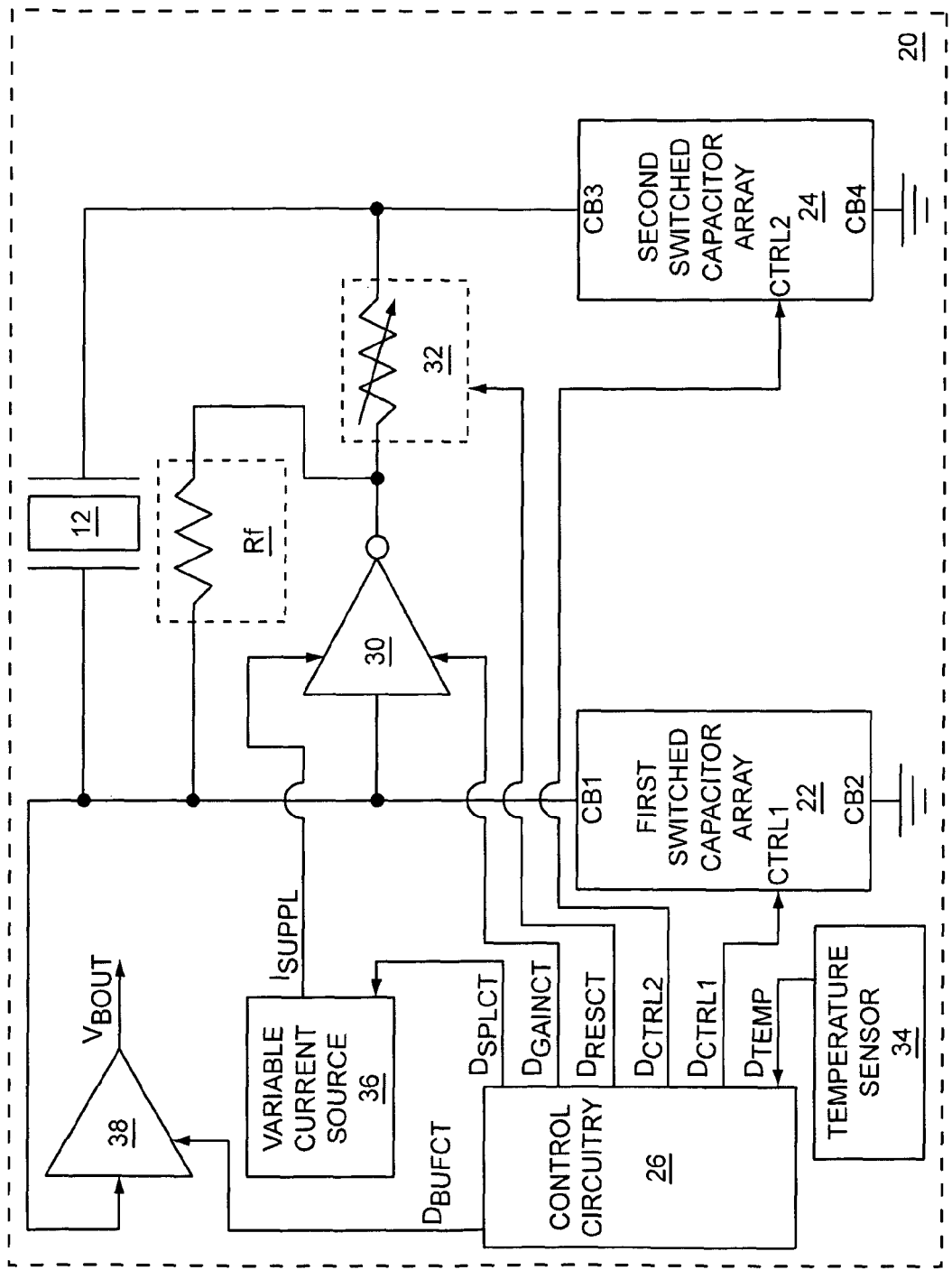
FIG. 5 shows an alternate embodiment of the DCPXO illustrated in FIG. 3.

FIG. 5 shows an alternate embodiment of the DCPXO 20 illustrated in FIG. 3. The DCPXO 20 includes the resonating crystal 12, the first and second switched-capacitor arrays 22, 24, the control circuitry 26, a gain selectable inverting active core 30, a variable resistance circuit 32, a temperature sensor 34, a variable current source 36, an output buffer 38, and a feedback resistor $R_f$. The feedback resistor $R_f$ is coupled between an input and an output of the gain selectable inverting active core 30 and may be used to provide a DC path to the input of the gain selectable inverting active core 30. The first common bus CB1 of the first switched-capacitor array 22 is coupled to the input of the gain selectable inverting active core 30. The variable resistance circuit 32 is coupled between the output of the gain selectable inverting active core 30 and the third common bus CB3 of the second switched-capacitor array 24. The resonating crystal 12 is coupled between the input of the $_{gain}$ selectable inverting active core 30 and the third common bus CB3 of the second switched-capacitor array 24. The input of the output buffer 38 is coupled to the input of the gain selectable inverting active core 30. The second and fourth common buses CB2, CB4 of the first and second switched-capacitor arrays 22, 24, respectively, are coupled to ground. In an additional embodiment of the present invention, the second and fourth common buses CB2, CB4 of the first and second switched-capacitor arrays 22, 24, respectively, are coupled to a DC reference instead of ground.

The control circuitry 26 provides the first and second capacitor control logic signals $D_{CTRL1}$, $D_{CTRL2}$ to the first and second control inputs CTRL1, CTRL2 of the first and second switched-capacitor arrays 22, 24, respectively. The temperature sensor 34 measures a temperature near the resonating components of the DCPXO 20 and provides a temperature signal $D_{TEMP}$ to the control circuitry 26 that is indicative of the measured temperature. The control circuitry 26 determines first and second capacitance corrections based on changes of the measured temperature to maintain a constant output frequency. The correlation of the first and second capacitance corrections to the measured temperature are based on characterizing a temperature drift of the DCPXO 20 and relating the measured temperature changes to corresponding output frequency changes, and relating the output frequency changes to corresponding first and second capacitance changes. The first and second capacitance corrections may utilize at least one look-up table (LUT) to store the correlations. Additionally, a frequency offset error may be measured at a specific temperature, such as room temperature, and used in the first and second capacitance corrections. A DCPXO 20 that corrects for temperature changes is a temperature-compensated DCPXO 20.

The control circuitry 26 provides a supply control signal $D_{SPLCT}$ to the variable current source 36, which provides a supply current $I_{SUPPL}$ to the gain selectable inverting active core 30 based on the supply control signal $D_{SPLCT}$. The gain selectable inverting active core 30 has a gain, which is based on the supply current $I_{SUPPL}$. The control circuitry 26 selects either a start-up mode while the DCPXO 20 is starting-up or a normal operation mode while the DCPXO 20 is oscillating normally. In the start-up mode, the control circuitry 26 causes the gain selectable inverting active core 30 to operate with a higher gain than when operating in the normal operation mode. The higher gain may increase the reliability of crystal start-up and may reduce the crystal start-up time by compensating for losses in the crystal. By returning to a normal gain during the normal operation mode, power consumption, phase noise, or both may be reduced. A duration of the start-up mode may be based on a fixed timer, such that the start-up mode is exited after a fixed time period.

In an exemplary embodiment of the present invention, the control circuitry 26 selects either the start-up mode or the normal operation mode and provides the supply control signal $D_{SPLCT}$, which is based on the selection of the start-up mode or the normal operation mode. The variable current source 36 provides the supply current $I_{SUPPL}$, which is based on the supply control signal $D_{SPLCT}$. During the start-up mode, the gain selectable inverting active core 30 has a first gain, which is based on the supply current $I_{SUPPL}$, and during the normal operation mode, the gain selectable inverting active core 30 has a second gain, which is based on the supply current $I_{SUPPL}$, such that the first gain is greater than the second gain.

The resonating crystal 12, the first and second switched-capacitor arrays 22, 24, the gain selectable inverting active core 30, and the variable resistance circuit 32 form the feedback loop of the DCPXO 20. The control circuitry 26 provides a resistance control signal $D_{RESCT}$ to the variable resistance circuit 32, which provides a selectable resistance to the feedback loop based on the resistance control signal $D_{RESCT}$. The selectable resistance may introduce a small phase-shift in the feedback loop that affects the second order effect of adjusting the first and second switched-capacitor arrays 22, 24 in opposite directions. Therefore, the selectable resistance may be varied to change the step size of the fine tuning steps. In a first exemplary embodiment of the present invention, the control circuitry 26 selects a desired fine tuning step size and provides the resistance control signal $D_{RESCT}$, which is based on the desired fine tuning step size. The variable resistance circuit 32 provides the selectable resistance, which is based on the resistance control signal $D_{RESCT}$.

The variable resistance circuit 32 may be used to limit power consumption in the resonating crystal 12 to prevent damage to the resonating crystal 12. In a second exemplary embodiment of the present invention, the control circuitry 26 selects a desired maximum crystal power level and provides the resistance control signal $D_{RESCT}$, which is based on the desired maximum crystal power level. The variable resistance circuit 32 provides the selectable resistance, which is based on the resistance control signal $D_{RESCT}$.

The feedback loop of the DCPXO 20 has a loop gain. The loop gain needs to be high enough to provide reliable start-up and operation, and low enough to keep phase noise low. Specifically, the loop gain must be high enough to compensate for loss in the resonating crystal 12. Since the DCPXO 20 may be used with different crystal types, the loop gain of the DCPXO 20 may need to be adjusted to compensate for the different operating characteristics of the different crystal types. The control circuitry 26 provides a gain control signal $D_{GAINCT}$ to the gain selectable inverting active core 30 to control the gain of the gain selectable inverting active core 30. In one embodiment of the present invention, the gain selectable inverting active core 30 includes multiple gain selectable transistor elements, such that the gain of the gain selectable inverting active core 30 is based on gain selection of at least one of the gain selectable transistor elements, which is based on the gain control signal $D_{GAINCT}$. Therefore, three controllable elements may be adjusted to control the loop gain, namely, the gain of the gain selectable inverting active core 30 may be adjusted by varying the supply current $I_{SUPPL}$, the gain of the gain selectable inverting active core 30 may be adjusted by varying the gain control signal $D_{GAINCT}$, and the selectable resistance of the variable resistance circuit 32 may be adjusted by varying the resistance control signal $D_{RESCT}$. In an exemplary embodiment of the present invention, the control circuitry 26 adjusts the loop gain of the DCPXO 20 to compensate for the different operating characteristics of the different crystal types by varying the supply control signal $D_{SPLCT}$, by varying the gain control signal $D_{GAINCT}$, by varying the resistance control signal $D_{RESCT}$, or any combination thereof. During the start-up mode, the gain selectable inverting active core 30 has the first gain, which may be based on the operating characteristics of the different crystal types. During the normal operation mode, the gain selectable inverting active core 30 has the second gain, which may be based on the operating characteristics of the different crystal types.

An output of the output buffer 38 provides a buffer output signal $V_{BOUT}$, which is based on the input of the output buffer 38. The control circuitry 26 provides a buffer control signal $D_{BUFCT}$ to the output buffer 38 based on a desired output voltage swing of the buffer output signal $V_{BOUT}$. The output buffer 38 provides an output voltage swing of the buffer output signal $V_{BOUT}$ based on the buffer control signal $D_{BUFCT}$. The desired output voltage swing may be based on minimizing harmonics in the buffer output signal $V_{BOUT}$. In an alternate embodiment of the present invention, the input of the output buffer 38 is coupled to the output of the gain selectable inverting active core 30. Alternate embodiments of the present invention may omit any or all of the variable resistance circuit 32, the temperature sensor 34, the output buffer 38, and the feedback resistor $R_f$. The gain selectable inverting active core 30 may be replaced with a non-gain selectable active core. The variable current source 36 may be replaced with a non-variable current source or a voltage source.

Figure 6:
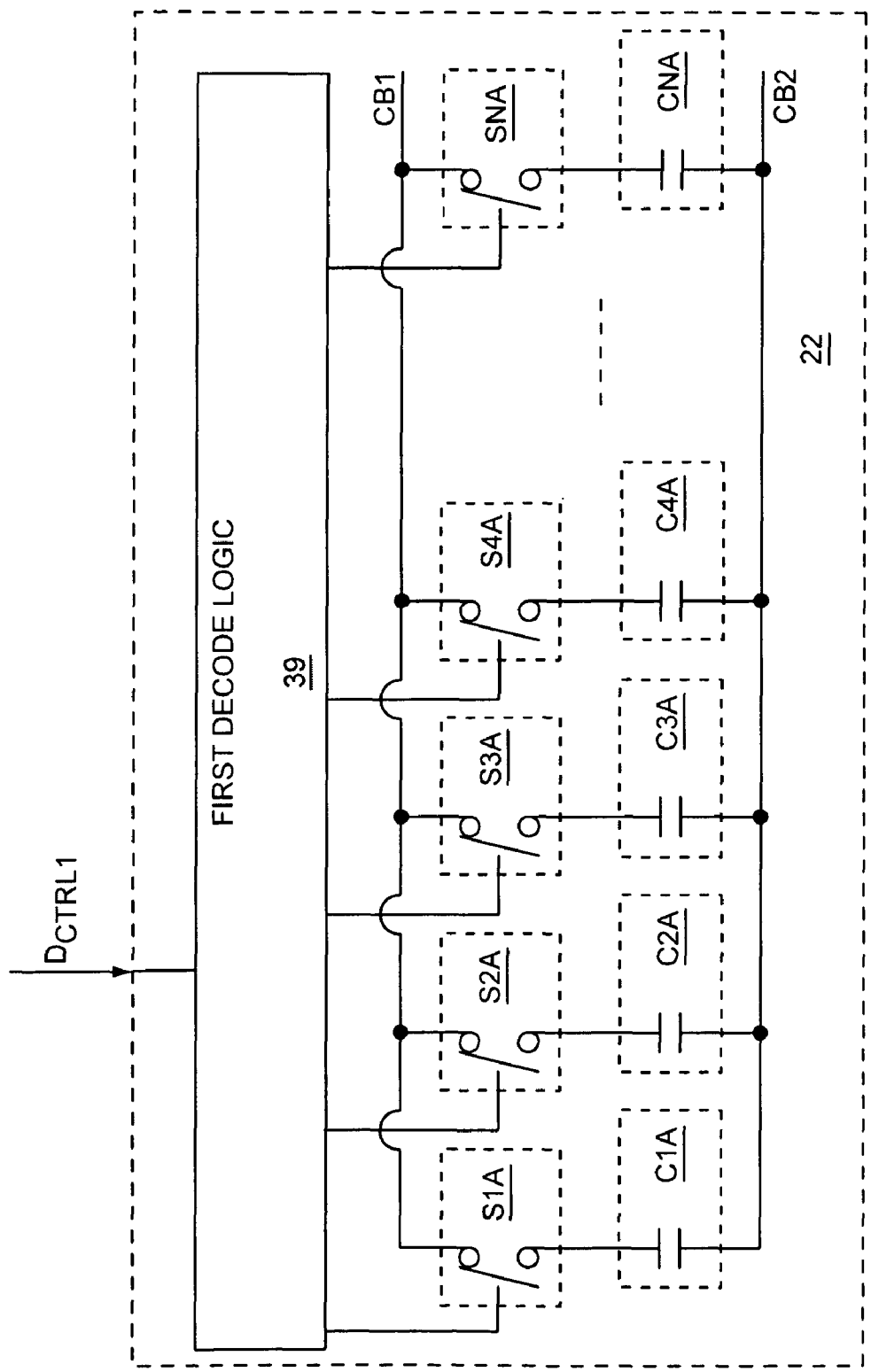
FIG. 6 shows details of a first switched-capacitor array illustrated in FIG. 3.

FIG. 6 shows details of the first switched-capacitor array 22 illustrated in FIG. 3, according to one embodiment of the first switched-capacitor array 22. The first switched-capacitor array 22 includes a first alpha switching element S1A, a second alpha switching element S2A, a third alpha switching element S3A, a fourth alpha switching element S4A, up to and including an Nth alpha switching element SNA, a first alpha capacitive element C1A, a second alpha capacitive element C2A, a third alpha capacitive element C3A, a fourth alpha capacitive element C4A, up to and including an Nth alpha capacitive element CNA, and first decode logic 39. Each of the first, second, third, fourth, up to and including the Nth alpha capacitive elements C1A, C2A, C3A, C4A, CNA may be of about equal capacitance value. Each of the first, second, third, fourth, up to and including the Nth alpha switching elements S1A, S2A, S3A, S4A, SNA may be of about equal switch size.

Switching contacts of the first alpha switching element S1A are coupled between the first common bus CB1 of the first switched-capacitor array 22 and one end of the first alpha capacitive element C1A. Switching contacts of the second alpha switching element S2A are coupled between the first common bus CB1 and one end of the second alpha capacitive element C2A. Switching contacts of the third alpha switching element S3A are coupled between the first common bus CB1 and one end of the third alpha capacitive element C3A. Switching contacts of the fourth alpha switching element S4A are coupled between the first common bus CB1 and one end of the fourth alpha capacitive element C4A. Switching contacts of the Nth alpha switching element SNA are coupled between the first common bus CB1 and one end of the Nth alpha capacitive element CNA.

The other ends of the first, second, third, fourth, and Nth alpha capacitive elements C1A, C2A, C3A, C4A, CNA are coupled to the second common bus CB2 of the first switched-capacitor array 22. The first capacitor control logic signal $D_{CTRL1}$ is fed to the first decode logic 39, which decodes information in the first capacitor control logic signal $D_{CTRL1}$ and provides appropriate control signals to control inputs of the first, second, third, fourth, and Nth alpha switching elements S1A, S2A, S3A, S4A, SNA to individually OPEN or CLOSE any or all of the first, second, third, fourth, and Nth alpha switching elements S1A, S2A, S3A, S4A, SNA. To select any or all of the first, second, third, fourth, and Nth alpha capacitive elements C1A, C2A, C3A, C4A, CNA, the respective first, second, third, fourth, and Nth alpha switching elements S1A, S2A, S3A, S4A, SNA are CLOSED, thereby coupling any selected capacitive elements between the first common bus CB1 and the second common bus CB2. Conversely, to de-select any or all of the first, second, third, fourth, and Nth alpha capacitive elements C1A, C2A, C3A, C4A, CNA, the respective first, second, third, fourth, and Nth alpha switching elements S1A, S2A, S3A, S4A, SNA are OPENED, thereby isolating any de-selected capacitive elements from the first common bus CB1.

In an alternate embodiment of the first switched-capacitor array 22, the switching contacts of the first alpha switching element S1A are coupled between the second common bus CB2 of the first switched-capacitor array 22 and one end of the first alpha capacitive element C1A. The switching contacts of the second alpha switching element S2A are coupled between the second common bus CB2 and one end of the second alpha capacitive element C2A. The switching contacts of the third alpha switching element S3A are coupled between the second common bus CB2 and one end of the third alpha capacitive element C3A. The switching contacts of the fourth alpha switching element S4A are coupled between the second common bus CB2 and one end of the fourth alpha capacitive element C4A. The switching contacts of the Nth alpha switching element SNA are coupled between the second common bus CB2 and one end of the Nth alpha capacitive element CNA. The other ends of the first, second, third, fourth, and Nth alpha capacitive elements C1A, C2A, C3A, C4A, CNA are coupled to the first common bus CB1 of the first switched-capacitor array 22.

Figure 7:
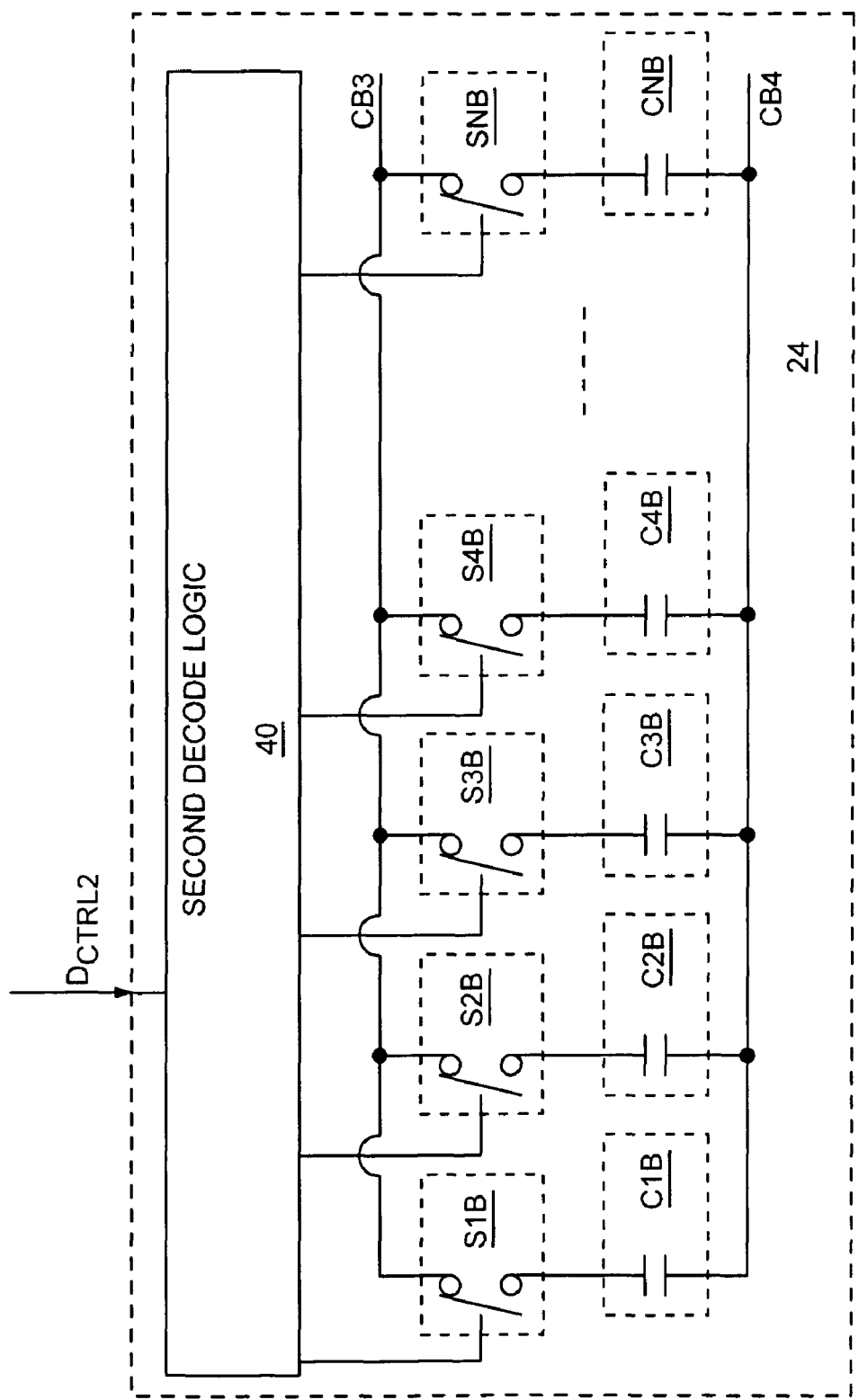
FIG. 7 shows details of a second switched-capacitor array illustrated in FIG. 3.

FIG. 7 shows details of the second switched-capacitor array 24 illustrated in FIG. 3. The second switched-capacitor array 24 includes a first beta switching element S1B, a second beta switching element S2B, a third beta switching element S3B, a fourth beta switching element S4B, up to and including an Nth beta switching element SNB, a first beta capacitive element C1B, a second beta capacitive element C2B, a third beta capacitive element C3B, a fourth beta capacitive element C4B, up to and including an Nth beta capacitive element CNB. Each of the first, second, third, fourth, up to and including the Nth beta capacitive elements C1B, C2B, C3B, C4B, CNB may be of about equal capacitance value. Each of the first, second, third, fourth, up to and including the Nth beta switching elements S1B, S2B, S3B, S4B, SNB may be of about equal switch size.

Switching contacts of the first beta switching element S1B are coupled between the third common bus CB3 of the second switched-capacitor array 24 and one end of the first beta capacitive element C1B. Switching contacts of the second beta switching element S2B are coupled between the third common bus CB3 and one end of the second beta capacitive element C2B. Switching contacts of the third beta switching element S3B are coupled between the third common bus CB3 and one end of the third beta capacitive element C3B. Switching contacts of the fourth beta switching element S4B are coupled between the third common bus CB3 and one end of the fourth beta capacitive element C4B. Switching contacts of the Nth beta switching element SNB are coupled between the third common bus CB3 and one end of the Nth beta capacitive element CNB.

The other ends of the first, second, third, fourth, and Nth beta capacitive elements C1B, C2B, C3B, C4B, CNB are coupled to the fourth common bus CB4 of the second switched-capacitor array 24. The second capacitor control logic signal $D_{CTRL2}$ is fed to a second decode logic 40, which decodes information in the second capacitor control logic signal $D_{CTRL2}$ and provides appropriate control signals to control inputs of the first, second, third, fourth, and Nth beta switching elements S1B, S2B, S3B, S4B, SNB to individually OPEN or CLOSE any or all of the first, second, third, fourth, and Nth beta switching elements S1B, S2B, S3B, S4B, SNB. To select any or all of the first, second, third, fourth, and Nth beta capacitive elements C1B, C2B, C3B, C4B, CNB, the respective first, second, third, fourth, and Nth beta switching elements S1B, S2B, S3B, S4B, SNB are CLOSED, thereby coupling any selected capacitive elements between the third common bus CB3 and the fourth common bus CB4. Conversely, to de-select any or all of the first, second, third, fourth, and Nth beta capacitive elements C1B, C2B, C3B, C4B, CNB, the respective first, second, third, fourth, and Nth beta switching elements S1B, S2B, S3B, S4B, SNB are OPENED, thereby isolating any de-selected capacitive elements from the third common bus CB3.

In an alternate embodiment of the second switched-capacitor array 24, the switching contacts of the first beta switching element S1B are coupled between the fourth common bus CB4 of the second switched-capacitor array 24 and one end of the first beta capacitive element C1B. The switching contacts of the second beta switching element S2B are coupled between the fourth common bus CB4 and one end of the second beta capacitive element C2B. The switching contacts of the third beta switching element S3B are coupled between the fourth common bus CB4 and one end of the third beta capacitive element C3B. The switching contacts of the fourth beta switching element S4B are coupled between the fourth common bus CB4 and one end of the fourth beta capacitive element C4B. The switching contacts of the Nth beta switching element SNB are coupled between the fourth common bus CB4 and one end of the Nth beta capacitive element CNB. The other ends of the first, second, third, fourth, and Nth beta capacitive elements C1B, C2B, C3B, C4B, CNB are coupled to the third common bus CB3 of the second switched-capacitor array 24.

Figure 8:
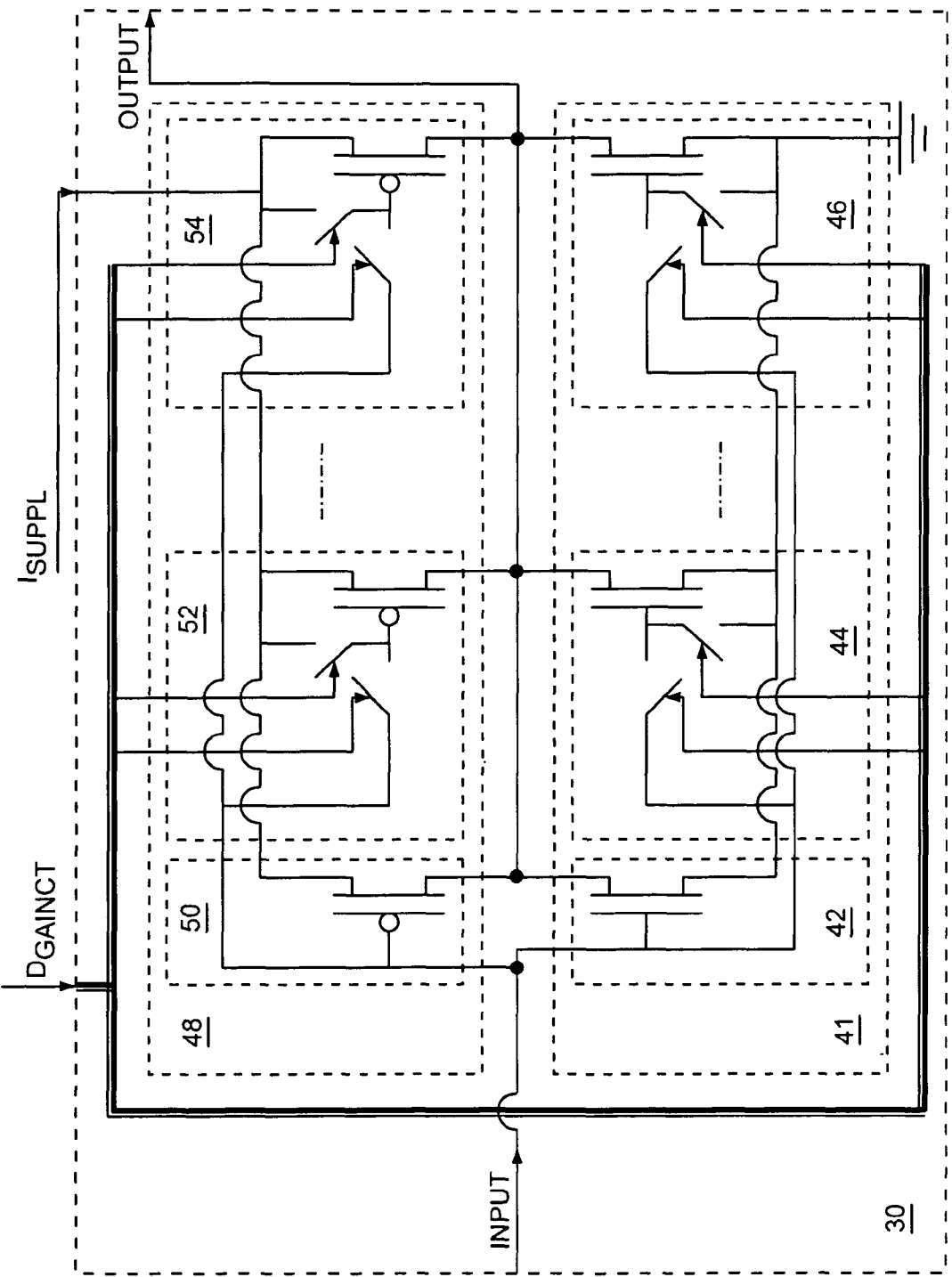
FIG. 8 shows details of a gain selectable inverting active core illustrated in FIG. 5.

FIG. 8 shows details of the gain selectable inverting active core 30 illustrated in FIG. 5, according to one embodiment of the gain selectable inverting active core 30. The gain selectable inverting active core 30 includes an N-type gain selectable transistor element 41 having a first N-type segment 42, a second N-type segment 44, up to and including an Nth N-type segment 46, and a P-type gain selectable transistor element 48 having a first P-type segment 50, a second P-type segment 52, up to and including an Nth P-type segment 54. The N-type and P-type gain selectable transistor elements 41, 48 are arranged in a complementary manner to function as an inverting amplifier. The second through Nth N-type segments 44, 46 and the second through Nth P-type segments 52, 54 are selectable segments, which are used to vary the effective sizes of the N-type and P-type gain selectable transistor elements 41, 48, thereby varying the gain of the gain selectable inverting active core 30.

An input INPUT of the gain selectable inverting active core 30 is coupled to the gates of the first through Nth N-type segments 42, 44, 46 and the first through Nth P-type segments 50, 52, 54 either directly or through switching elements, which are used to select or de-select individual segments. The sources of the first through Nth P-type segments 50, 52, 54 receive the supply current $I_{SUPPL}$ and the sources of the first through Nth N-type segments 42, 44, 46 are coupled to ground. The drains of the first through Nth N-type segments 42, 44, 46 and the first through Nth P-type segments 50, 52, 54 are coupled to an output OUTPUT of the gain selectable inverting active core 30. The gain control signal $D_{GAINCT}$ is fed to control inputs of the switching elements that are used to select or de-select individual segments, which may be individually selectable.

Figure 9:
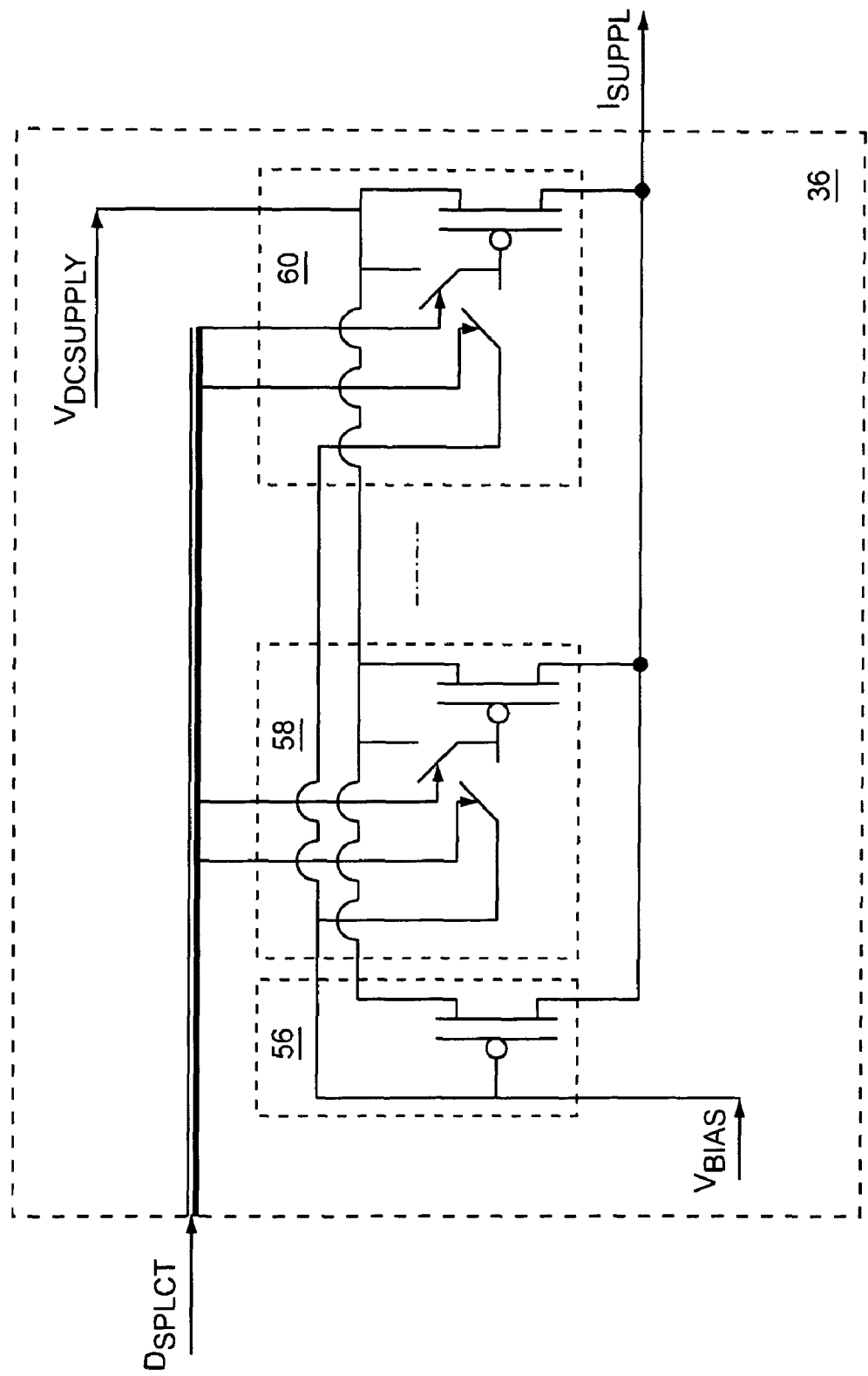
FIG. 9 shows details of a variable current source illustrated in FIG. 5.

FIG. 9 shows details of the variable current source 36 illustrated in FIG. 5, according to one embodiment of the variable current source 36. The variable current source 36 includes a first P-type gain transistor element 56, a second P-type gain transistor element 58, up to and including an Nth P-type gain transistor element 60. The second through Nth P-type gain transistor elements 58, 60 are selectable transistor elements, which are used to vary the supply current $I_{SUPPL}$ based on the supply control signal $D_{SPLCT}$, thereby varying the gain of the gain selectable inverting active core 30 during the start-up mode.

A bias voltage $V_{BIAS}$ is coupled to the gates of the first through Nth P-type gain transistor elements 56, 58, 60 either directly or through switching elements, which are used to select or de-select individual P-type switching elements. The sources of the first through Nth P-type gain transistor elements 56, 58, 60 are fed from a DC power supply $V_{DCSUPPLY}$. The drains of the first through Nth P-type gain transistor elements 56, 58, 60 are coupled to one another and provide the supply current $I_{SUPPL}$. The supply control signal $D_{SPLCT}$ is fed to control inputs of the switching elements that are used to select or de-select the second through Nth P-type gain transistor elements 58, 60, which may be individually selectable. The current supplied from each of the first through Nth P-type gain transistor elements 56, 58, 60 may be binary weighted.

Figure 10:
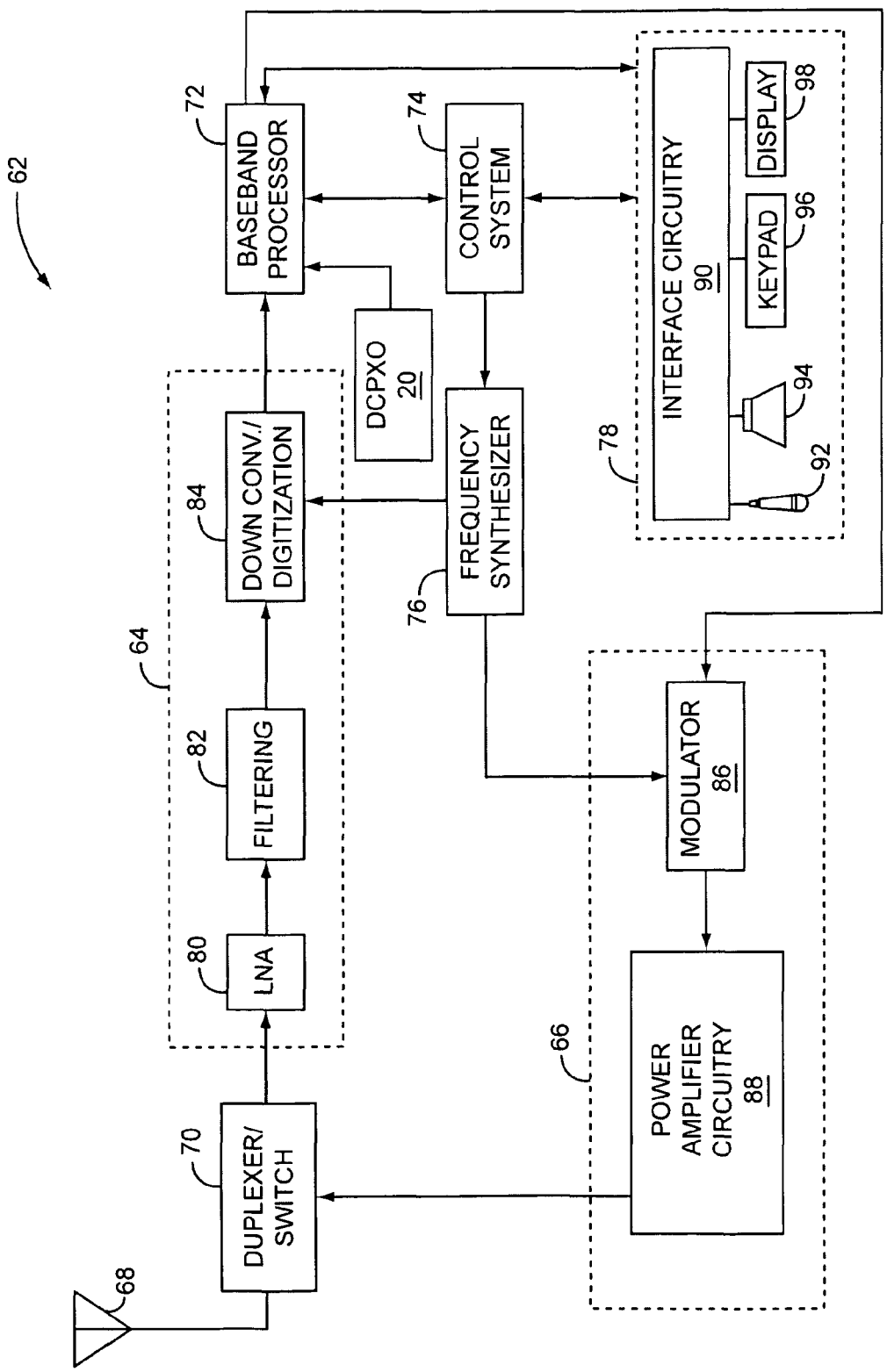
FIG. 10 shows an application example of the present invention used in a mobile terminal.

An application example of a DCPXO 20 is to provide a reference clock in a mobile terminal 62, the basic architecture of which is represented in FIG. 10. The mobile terminal 62 may include a receiver front end 64, a radio frequency transmitter section 66, an antenna 68, a duplexer or switch 70, a baseband processor 72, a control system 74, a frequency synthesizer 76, and an interface 78. The receiver front end 64 receives information bearing radio frequency signals from one or more remote transmitters provided by a base station (not shown). A low noise amplifier (LNA) 80 amplifies the signal. Filtering 82 minimizes broadband interference in the received signal, while down conversion and digitization circuitry 84 down converts the filtered, received signal to an intermediate or baseband frequency signal, which is then digitized into one or more digital streams. The receiver front end 64 typically uses one or more mixing frequencies generated by the frequency synthesizer 76. The baseband processor 72 processes the digitized received signal to extract the information or data bits conveyed in the received signal. The DCPXO 20 provides an accurate reference clock to the baseband processor 72 for processing the received signal. This processing typically comprises demodulation, decoding, and error correction operations. As such, the baseband processor 72 is generally implemented in one or more digital signal processors (DSPs).

On the transmit side, the baseband processor 72 receives digitized data, which may represent voice, data, or control information, from the control system 74, which it encodes for transmission. The encoded data is output to the transmitter 66, where it is used by a modulator 86 to modulate a carrier signal that is at a desired transmit frequency. Power amplifier circuitry 88 amplifies the modulated carrier signal to a level appropriate for transmission, and delivers the amplified and modulated carrier signal to the antenna 68 through the duplexer or switch 70.

A user may interact with the mobile terminal 62 via the interface 78, which may include interface circuitry 90 associated with a microphone 92, a speaker 94, a keypad 96, and a display 98. The interface circuitry 90 typically includes analog-to-digital converters, digital-to-analog converters, amplifiers, and the like. Additionally, it may include a voice encoder/decoder, in which case it may communicate directly with the baseband processor 72. The microphone 92 will typically convert audio input, such as the user's voice, into an electrical signal, which is then digitized and passed directly or indirectly to the baseband processor 72. Audio information encoded in the received signal is recovered by the baseband processor 72, and converted by the interface circuitry 90 into an analog signal suitable for driving the speaker 94. The keypad 96 and display 98 enable the user to interact with the mobile terminal 62, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A digitally-controlled crystal oscillator (DCXO) circuit comprising:
   an active core;
   a first thermometer-coded switched-capacitor circuit (TC-SCC) coupled to the active core and to a crystal, and adapted to:
       select at least one of a first plurality of capacitive elements based on a first control signal; and
       provide a first capacitance based on the selection of the at least one of the first plurality of capacitive elements;
   a second TCSCC coupled to the active core and to the crystal, and adapted to:
       select at least one of a second plurality of capacitive elements based on a second control signal; and
       provide a second capacitance based on the selection of the at least one of the second plurality of capacitive elements; and
   control circuitry adapted to, during a first fine tuning frequency step:
       provide the first control signal to increase the first capacitance; and
       provide the second control signal to decrease the second capacitance,
   wherein the active core, the crystal, the first TCSCC, and the second TCSCC form a crystal oscillator, which is adapted to provide an output signal having an output frequency based on the active core, the crystal, the first capacitance, and the second capacitance.

2. The DCXO circuit of claim 1 wherein the control circuitry is further adapted to, during a second fine tuning frequency step:
   provide the first control signal, such that the first capacitance is decreased; and
   provide the second control signal, such that the second capacitance is increased.

3. The DCXO circuit of claim 2 wherein:
   the active core is an inverting active core having an input and an output;
   the crystal is coupled between the input and the output;
   the first TCSCC is coupled between the input and a direct current (DC) reference; and
   the second TCSCC is coupled between the output and the DC reference,
   wherein the crystal oscillator is a Pierce crystal oscillator.

4. The DCXO circuit of claim 3 wherein the DC reference is about ground.

5. The DCXO circuit of claim 2 wherein:
   the active core is a non-inverting active core having an input and an output;
   the crystal is coupled between the input and a direct current (DC) reference;
   the first TCSCC is coupled between the input and the output; and
   the second TCSCC is coupled between the output and the DC reference,
   wherein the crystal oscillator is a Colpitts crystal oscillator.

6. The DCXO circuit of claim 2 wherein during any tuning frequency step:
   that is intended to increase the first capacitance, at least one of the first plurality of capacitive elements is additionally selected and none of the first plurality of capacitive elements is additionally de-selected;

that is intended to decrease the first capacitance, at least one of the first plurality of capacitive elements is additionally de-selected and none of the first plurality of capacitive elements is additionally selected;

that is intended to increase the second capacitance, at least one of the second plurality of capacitive elements is additionally selected and none of the second plurality of capacitive elements is additionally de-selected; and that is intended to decrease the second capacitance, at least one of the second plurality of capacitive elements is additionally de-selected and none of the second plurality of capacitive elements is additionally selected.

7. The DCXO circuit of claim 6 wherein a capacitance of each of the first plurality of capacitive elements is about equal to a first value and a capacitance of each of the second plurality of capacitive elements is about equal to a second value.

8. The DCXO circuit of claim 7 wherein the first value is about equal to the second value.

9. The DCXO circuit of claim 2 wherein:
the DCXO circuit further comprises a temperature sensor adapted to:
measure a temperature associated with the crystal oscillator; and
provide a temperature signal based on the temperature; and
the control circuitry is further adapted to receive the temperature signal and provide the first control signal and the second control signal based on the temperature signal,
wherein the DCXO circuit is a temperature-compensated DCXO circuit.

10. The DCXO circuit of claim 2 wherein the control circuitry is further adapted to:
during a first nominal tuning frequency step:
provide the first control signal, such that the first capacitance is decreased; and
provide the second control signal, such that the second capacitance is held about constant;
during a second nominal tuning frequency step:
provide the first control signal, such that the first capacitance is increased; and
provide the second control signal, such that the second capacitance is held about constant;
during a first coarse tuning frequency step:
provide the first control signal, such that the first capacitance is decreased; and
provide the second control signal, such that the second capacitance is decreased; and
during a second coarse tuning frequency step:
provide the first control signal, such that the first capacitance is increased; and
provide the second control signal, such that the second capacitance is increased.

11. The DCXO circuit of claim 10 wherein the control circuitry is further adapted to select one of the first fine tuning frequency step, the second fine tuning frequency step, the first nominal tuning frequency step, the second nominal tuning frequency step, the first coarse tuning frequency step, and the second coarse tuning frequency step based on controlling the output frequency, which is associated with an output frequency setpoint.

12. The DCXO circuit of claim 10 wherein:
the control circuitry is further adapted to select one of a start-up mode and a normal operation mode;
during the start-up mode, the active core has a first gain; and
during the normal operation mode, the active core has a second gain, such that the first gain is greater than the second gain.

13. The DCXO circuit of claim 12 further comprising a variable current source adapted to:
receive a supply control signal, which is based on the selection of the one of the start-up mode and the normal operation mode; and
provide a supply current to the active core, such that the supply current is based on the supply control signal,
wherein during the start-up mode, the first gain is based on the supply current and during the normal operation mode, the second gain is based on the supply current.

14. The DCXO circuit of claim 13 wherein during the start-up mode, the first gain is further based on operating characteristics of the crystal, and during the normal operation mode, the second gain is further based on the operating characteristics of the crystal.

15. The DCXO circuit of claim 14 wherein:
the control circuitry is further adapted to:
provide a gain control signal based on the operating characteristics of the crystal; and
provide a resistance control signal based on the operating characteristics of the crystal;
the active core comprises a plurality of gain selectable transistor elements, such that gain selection of at least one of the plurality of gain selectable transistor elements is based on the gain control signal;
during the start-up mode, the first gain is further based on the selection of the at least one of the plurality of gain selectable transistor elements;
during the normal operation mode, the second gain is further based on the selection of the at least one of the plurality of gain selectable transistor elements; and
the DCXO circuit further comprises a variable resistance circuit coupled in series with an output of the active core and adapted to provide a resistance based on the resistance control signal,
wherein the crystal oscillator has a loop gain, which:
during the start-up mode is based on the first gain and the resistance; and
during the normal operation mode is based on the second gain and the resistance.

16. The DCXO circuit of claim 12 wherein a duration of the start-up mode is based on a fixed time period.

17. The DCXO circuit of claim 10 wherein:
the control circuitry is further adapted to:
provide a gain control signal based on operating characteristics of the crystal; and
provide a resistance control signal based on the operating characteristics of the crystal;
the active core has a core gain based on the gain control signal; and
the DCXO circuit further comprises a variable resistance circuit coupled in series with an output of the active core and adapted to provide a resistance based on the resistance control signal,
wherein the crystal oscillator has a loop gain based on the core gain and the resistance.

18. The DCXO circuit of claim 17 wherein the resistance control signal is further based on limiting power consumption in the crystal to prevent damage to the crystal.

19. The DCXO circuit of claim 17 wherein the gain control signal is used to control a bias point of the active core, such that the bias point is associated with a bias point setpoint.

20. The DCXO circuit of claim 2 wherein:

the control circuitry is further adapted to provide a buffer control signal based on a desired buffer output voltage swing of a buffer output signal; and the DCXO circuit further comprises an output buffer adapted to:

provide the buffer output signal based on the output signal; and control an output voltage swing of the buffer output signal based on the buffer control signal.

21. The DCXO circuit of claim 20 wherein the desired buffer output voltage swing is based on minimizing harmonics in the buffer output signal.

22. The DCXO circuit of claim 20 wherein an input of the active core is adapted to provide the output signal.

23. The DCXO circuit of claim 2 wherein:

the control circuitry is further adapted to:

select a desired fine tuning frequency step size; and provide a resistance control signal based on the selected desired fine tuning frequency step size; and the DCXO circuit further comprises a variable resistance circuit coupled in series with an output of the active core and adapted to provide a resistance based on the resistance control signal, wherein the output frequency is further based on the resistance.

24. A method comprising:

providing an active core;

providing a first thermometer-coded switched-capacitor circuit (TCSCC);

coupling the first TCSCC to the active core and to a crystal;

selecting at least one of a first plurality of capacitive elements based on a first control signal;

providing a first capacitance based on the selection of the at least one of the first plurality of capacitive elements;

providing a second TCSCC;

coupling the second TCSCC to the active core and to the crystal;

selecting at least one of a second plurality of capacitive elements based on a second control signal;

providing a second capacitance based on the selection of the at least one of the second plurality of capacitive elements; and providing a fine tuning frequency step by:

providing the first control signal to increase the first capacitance; and providing the second control signal to decrease the second capacitance, wherein the active core, the crystal, the first TCSCC, and the second TCSCC form a crystal oscillator, which is adapted to provide an output signal having an output frequency based on the active core, the crystal, the first capacitance, and the second capacitance.

* * * * *

UNITED STATES PATENT AND TRADEMARK OFFICE
CERTIFICATE OF CORRECTION

| | | |
|---|---|---|
| PATENT NO. | : 7,868,710 B1 | |
| APPLICATION NO. | : 12/365528 | |
| DATED | : January 11, 2011 | |
| INVENTOR(S) | : Shayan Farahvash et al. | |

It is certified that error appears in the above-identified patent and that said Letters Patent is hereby corrected as shown below:

In column 16, at line 53 in claim 4, delete "about"

Signed and Sealed this
Twelfth Day of April, 2011

David J. Kappos
*Director of the United States Patent and Trademark Office*